(12) United States Patent
Cheng et al.

(10) Patent No.: US 8,008,138 B2
(45) Date of Patent: Aug. 30, 2011

(54) EXTREMELY THIN SEMICONDUCTOR ON INSULATOR SEMICONDUCTOR DEVICE WITH SUPPRESSED DOPANT SEGREGATION

(75) Inventors: Kangguo Cheng, Albany, NY (US); Bruce B. Doris, Yorktown Heights, NY (US); Ghavam G. Shahidi, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 12/627,424

(22) Filed: Nov. 30, 2009

(65) Prior Publication Data

US 2011/0127608 A1 Jun. 2, 2011

(51) Int. Cl.
*H01L 21/00* (2006.01)
*H01L 21/84* (2006.01)

(52) U.S. Cl. ........ 438/157; 438/163; 438/459; 257/347; 257/353; 257/365; 257/E29.275; 257/E21.561

(58) Field of Classification Search ............... 438/157, 438/163, 459; 257/347, 353, 365, E29.275, 257/E29.137, E21.561
See application file for complete search history.

(56) References Cited

U.S. PATENT DOCUMENTS

| 6,060,749 | A | 5/2000 | Wu |
| 7,033,913 | B2* | 4/2006 | Usuda et al. ............ 438/459 |
| 7,060,546 | B2 | 6/2006 | Hsu et al. |
| 7,202,123 | B1 | 4/2007 | Pan |
| 7,358,571 | B2 | 4/2008 | Ko et al. |

* cited by examiner

*Primary Examiner* — Tu-Tu V Ho
(74) *Attorney, Agent, or Firm* — Scully, Scott, Murphy & Presser, P.C.; Louis J. Percello, Esq.

(57) ABSTRACT

A method of fabricating a semiconductor device is provided in which the channel of the device is present in an extremely thin semiconductor-on-insulator (ETSOI) layer, i.e., a semiconductor layer having a thickness of less than 20 nm. In one embodiment, the method begins with forming a first semiconductor layer and epitaxially growing a second semiconductor layer on a handling substrate. A first gate structure is formed on a first surface of the second semiconductor layer and source regions and drain regions are formed adjacent to the gate structure. The handling substrate and the first semiconductor layer are removed to expose a second surface of the second semiconductor layer that is opposite the first surface of the semiconductor layer. A second gate structure or a dielectric region is formed in contact with the second surface of the second semiconductor layer.

17 Claims, 7 Drawing Sheets

EXTREMELY THIN SEMICONDUCTOR ON INSULATOR SEMICONDUCTOR DEVICE WITH SUPPRESSED DOPANT SEGREGATION

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device. With FET scaling reaching fundamental limits, the semiconductor industry is looking at more unconventional geometries that will facilitate continued device performance improvements.

SUMMARY

A method of fabricating a semiconductor device is provided in which the channel of the device is present in an extremely thin semiconductor-on-insulator (ETSOI) layer, i.e., a semiconductor containing layer having a thickness of less than 20 nm. In one embodiment, the method may begin with providing a handling substrate, forming a first semiconductor layer on the handling substrate, and epitaxially growing a second semiconductor layer on the first semiconductor layer, wherein the composition of the second semiconductor layer is different than the first semiconductor layer and the second semiconductor layer has a thickness of less than 20 nm. A first gate structure is formed on a first surface of the second semiconductor layer and a source region and a drain region are formed adjacent to the gate structure, wherein at least a portion of dopant of the source region and the drain region are present in at least the second semiconductor layer. The handling substrate and the first semiconductor layer are removed to expose a second surface of the second semiconductor layer that is opposite the first surface of the second semiconductor layer. A second gate structure or a dielectric region is formed in contact with the second surface of the second semiconductor layer.

In another aspect, a semiconductor device is provided that includes a channel region having a thickness of less than 20 nm. In one embodiment, a semiconductor device is provided that includes a channel region comprised of a semiconductor material having a thickness of less than 20 nm. A source region and a drain region are present on opposing sides of the channel region, wherein the source and drain regions have an upper layer composed of a first semiconductor material and a lower layer composed of a second semiconductor material. A first gate structure is in contact with a first surface of the channel region. The first gate structure includes a first gate dielectric layer in contact with a first surface of the channel region and at least one gate conductor layer in contact with the first gate dielectric layer. A second gate structure is in contact with a second surface of the channel region. The second gate structure is composed of a conformal gate dielectric layer that is present in direct contact with the lower layer of the source and drain regions and the channel region, and a second gate conductor layer in contact with the conformal gate dielectric layer.

DESCRIPTION OF SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
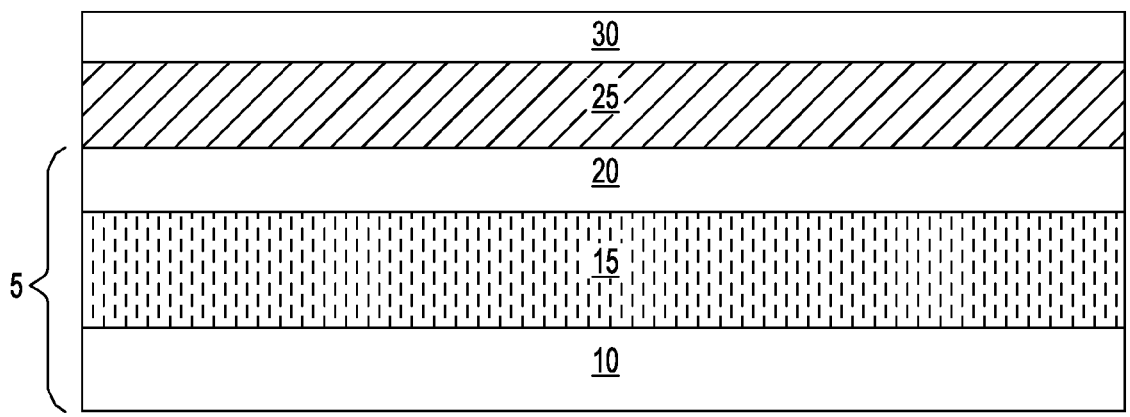
FIG. 1 is a side cross-sectional view depicting the resultant structure that is provided by a sequence that includes providing a handling substrate, forming a first semiconductor layer on the handling substrate, epitaxially growing a second semiconductor layer on the first semiconductor layer, wherein the composition of the second semiconductor layer is different than the first semiconductor layer and the second semiconductor layer has a thickness of less than 20 nm, in accordance with one embodiment of the invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method for forming a semiconductor device having an extremely thin semiconductor-on-insulator (ETSOI) layer. An extremely thin semiconductor-on-insulator (ETSOI) layer is a semiconductor layer having a thickness of 20 nm or less. In some embodiments, an extremely thin semiconductor-on-insulator (ETSOI) layer is a semiconductor layer having a thickness of 10 nm or less. In accordance with the present method and in one embodiment the ETSOI layer is provided by an epitaxially grown semiconductor layer. By utilizing the epitaxial growth process, the uniformity and thickness of the ETSOI layer may be more easily controlled than prior methods that rely upon etching and planarization processes to thin semiconductor layers to thicknesses of 20 nm or less. The epitaxially grown semiconductor layer that provides the ETSOI layer typically provides the channel region of the device. Further, in some embodiments, in which a layered semiconductor stack is employed to provide an epitaxially grown ETSOI layer, by removing the semiconductor layers that are underlying the epitaxially grown semiconductor layer, i.e., channel region, the method of the present invention removes the segregated dopants from the device. Segregated dopants typically result in high extension resistance at the interface between the source and drain regions and buried insulator layers. Therefore, in some embodiments, the present method reduces extension resistance at the interface between the source and drain regions and the buried insulator layer by reducing the presence of segregated dopants that are typically present in prior semiconductor devices that employ semiconductor on insulator substrates. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein a "field effect transistor" is a transistor in which output current, i.e., source-drain current, is controlled by the voltage applied to the gate. A field effect transistor has three terminals, i.e., gate, source and drain.

As used herein, the term "conductivity type" denotes a dopant region being p-type or n-type.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium and indium.

As used herein, "n-type" refers to the addition of impurities that contributes free electrons to an intrinsic semiconductor. In a silicon-containing substrate examples of n-type dopants, i.e., impurities, include but are not limited to antimony, arsenic and phosphorous.

A "gate structure" means a structure used to control output current (i.e., flow of carriers in the channel) of a semiconducting device through electrical or magnetic fields.

As used herein, a "gate dielectric" is a layer of an insulator between the semiconductor device substrate of a planar device, or fin structure, and the gate conductor.

A "gate conductor" means a conductive structure of the gate structure on the gate dielectric.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

As used herein, the term "raised" in combination with source and/or drain denotes that the source and/or drain region is formed on a semiconductor material layer that is present on an upper surface of the substrate on which the gate dielectric is present.

"Epitaxial growth and/or deposition" means the growth of a semiconductor material on a deposition surface of a semiconductor material, in which the semiconductor material being grown has the same crystalline characteristics as the semiconductor material of the deposition surface.

As used herein, the terms "insulating" and "dielectric" denote a material having a room temperature conductivity of less than about $10^{-10}(\Omega\text{-m})^{-1}$.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

FIG. 1 illustrates the results of the initial processing steps that produce a handling substrate 5, i.e., semiconductor-on-insulator (SOI) substrate, in which the handling substrate 5 comprises at least an upper semiconductor layer 20 overlying a dielectric layer 15. A lower semiconductor layer 10 may be present underlying the dielectric layer 15.

The upper semiconductor layer 20 may comprise any semiconducting material including, but not limited to Si, strained Si, SiC, SiGe, SiGeC, Si alloys, Ge, Ge alloys, GaAs, InAs, and InP, or any combination thereof. In one embodiment, the upper semiconductor layer 20 has a thickness ranging from 2 nm to 100.0 nm. In another embodiment, the upper semiconductor layer 20 has a thickness ranging from 15.0 nm to 50.0 nm. In a further embodiment, the upper semiconductor layer 20 has a thickness ranging from 20.0 nm to 30.0 nm. The lower semiconductor layer 10 may be composed of the same material having the same dimensions as the upper semiconductor layer 20. In one example, the lower semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The dielectric layer 15 that may be present between the upper semiconductor layer 20 and the lower semiconductor layer 10 may be formed by implanting a into the handling substrate 5 and then annealing the structure to form a buried insulating layer, i.e., dielectric layer 15. In another embodiment, the dielectric layer 15 may be deposited or grown prior to the formation of the upper semiconductor layer 20. In yet another embodiment, the handling substrate 5 may be formed using wafer-bonding techniques, where a bonded wafer pair is formed utilizing glue, adhesive polymer, or direct bonding. The dielectric layer 15 may be composed of any dielectric material, such as oxides, nitrides or oxynitride materials. In one example, the dielectric layer 15 is composed of silicon oxide. In another example, the dielectric layer 15 is composed of silicon nitride.

Still referring to FIG. 1, a first semiconductor layer 25 may be formed atop the upper semiconductor layer 20. In one embodiment, the first semiconductor layer 25 may be formed atop the upper semiconductor layer 20 using a deposition process, such as chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (EPCVD), Metal-Organic CVD (MOCVD), ultra-high vacuum CVD (UHV-CVD) and combinations thereof. Other examples for depositing a first semiconductor layer 25 include atomic layer deposition (ALD), evaporation, reactive sputtering, chemical solution deposition and other like deposition processes.

In one embodiment, the first semiconductor layer 25 may be formed using an epitaxial growth process. In one embodiment, the first semiconductor layer 25 may be provided by selective-epitaxial growth of SiGe atop the upper semiconductor layer 20. The Ge content of the epitaxial grown SiGe may range from 5% to 60%, by atomic weight %. In another embodiment, the Ge content of the epitaxial grown SiGe may range from 10% to 40%.

In one embodiment, the first semiconductor layer 25 may be composed of any semiconductor material, such as a silicon-containing material, so long as the semiconductor material is selected so that the upper semiconductor layer 20 of the handling substrate 5 may be etched selective to the first semiconductor layer 25. For example, the first semiconductor layer 25 may be selected from the group consisting of, but not limited to Si, strained Si, SiC, SiGe, SiGeC, Si alloys, Ge, Ge alloys, GaAs, InAs, InP as well as other III/V and II/VI compound semiconductors.

The thickness of the first semiconductor layer 25 may range from 5 nm to 100.0 nm. In another embodiment, the first semiconductor layer 25 has a thickness ranging from 15.0 nm to 50.0 nm. In a further embodiment, the first semiconductor layer 25 has a thickness ranging from 20.0 nm to 30.0 nm.

In another embodiment, the upper semiconductor layer 20 is omitted and the first semiconductor layer 25 directly contacts the dielectric layer 15. In this case, the first semiconductor layer 25 may be formed by the dielectric layer 15 by any known or future developed technique, for example, wafer bonding.

FIG. 1 also shows a second semiconductor layer 30 disposed on the first semiconductor layer. The second semiconductor layer 30 is the material layer that is processed to provide the channel region of the semiconductor device, e.g., field effect transistor (FET). In one embodiment, the second semiconductor layer 30 as employed in the final device structure has a thickness of 20 nm or less, and may be referred to as an extremely thin semiconductor-on-insulator (ETSOI) layer. In another embodiment, the second semiconductor layer 30 as employed in the final device structure has a thickness of 10 nm or less. In one embodiment, the second semiconductor layer 30 is composed of a silicon-containing material, and is formed using an epitaxial growth process. The epitaxial growth process provides a deposited layer having a superior uniformity that is challenging, if not impossible, to provide by thinning of semiconductor layers with etch and planarization methods. For example, the epitaxial growth process can provide the second semiconductor layer 30 on a 300 mm wafer with a thickness variation less than 0.5 nm. The thickness variation is the thickness difference between the maximum thickness and the minimum thickness of the second semiconductor layer 30 on the wafer. Further, in some examples, epitaxial growth of the second semiconductor layer 30 can achieve any desired thickness. In one embodiment, the second semiconductor layer 30 has a thickness ranging from 1.0 nm to 20.0 nm. In another embodiment, the second semiconductor layer 30 has a thickness ranging from 1.0 nm to 5.0 nm. In a further embodiment, the second semiconductor layer 30 has a thickness ranging from 3.0 nm to 8.0 nm.

In one embodiment, when the chemical reactants of the epitaxial deposition process are controlled and the system parameters set correctly, the depositing atoms arrive at the surface of the first semiconductor layer 25 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of amorphous or polycrystalline semiconductor instead of single crystal semiconductor. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 400° C. to 900° C. Although higher temperature typically results in faster deposition, the faster deposition may result in crystal defects and film cracking.

In one embodiment, the second semiconductor layer 30 may be selected from the group consisting of, but not limited to Si, strained Si, SiC, SiGe, SiGeC, Si alloys, Ge, Ge alloys, GaAs, InAs, InP as well as other III/V and II/VI compound semiconductors. In one embodiment, the second semiconductor layer 30 is single crystal silicon. In one example, the second semiconductor layer 30 is composed of silicon.

Figure 2:
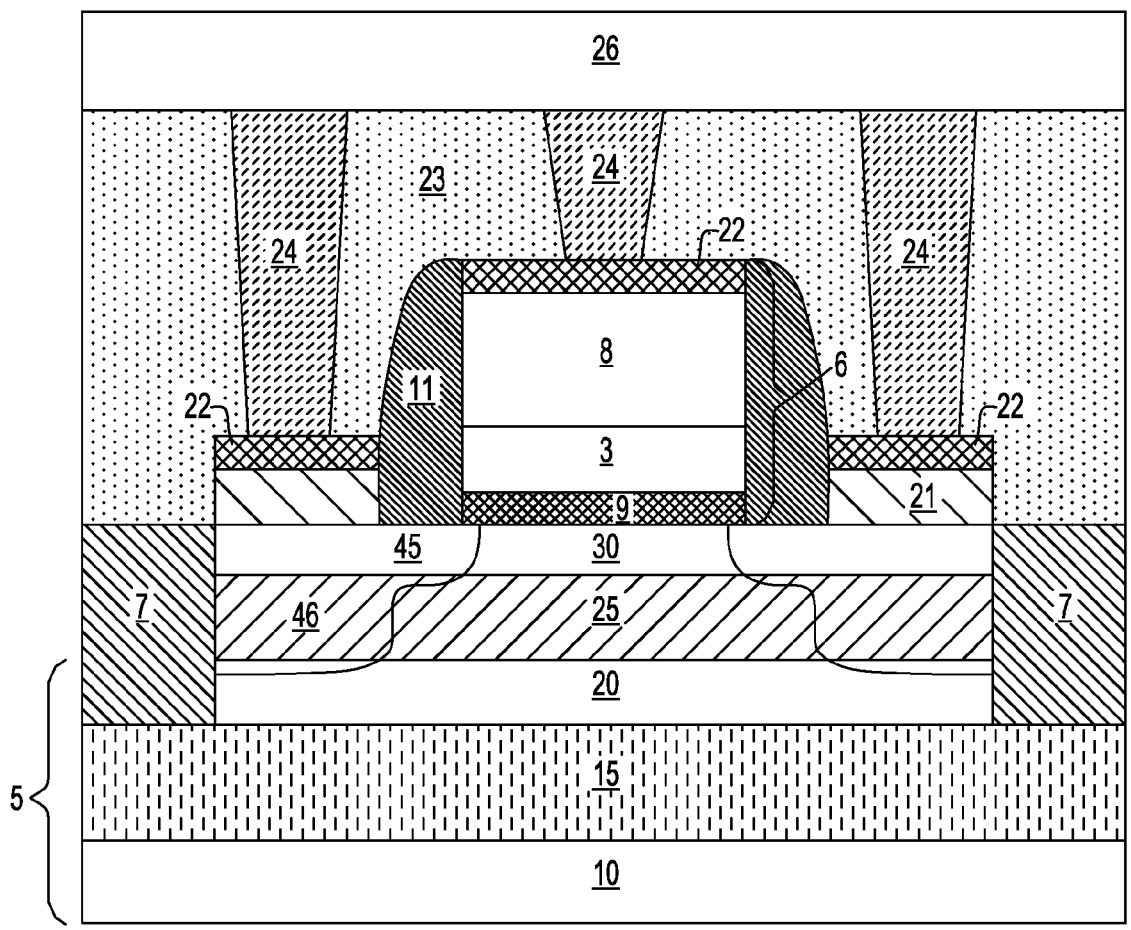
FIG. 2 is a side cross-sectional view depicting forming a semiconductor device on the structure depicted in FIG. 1 which includes the steps of forming a first gate structure on a first surface of the second semiconductor layer, forming a source region and a drain region adjacent to the first gate structure, and forming a series of connections to the source region, drain region and first gate structure, in accordance with one embodiment of the present invention.

Isolation regions 7 may be formed extending through the second semiconductor layer 30, the first semiconductor layer 25 and the upper semiconductor layer 20 of the handling substrate 5 stopping on the dielectric layer 15, i.e., buried dielectric layer, of the handling substrate 5. In one embodiment, the isolation regions 7 are formed by etching a trench into the handling substrate 5 through the first and second semiconductor layer 25, 30 utilizing a dry etching process, such as reactive-ion etching (RIE) or plasma etching. The trenches may optionally be lined with a liner material, e.g., an oxide, and then CVD or another like deposition process is used to fill the trench with polysilicon or another like STI dielectric material, such as an oxide, nitride or oxynitride. The STI dielectric may optionally be densified after deposition. A planarization process, such as chemical-mechanical polishing (CMP), may optionally be used to provide a planar structure, as depicted in FIG. 2. Besides STI isolation, isolation regions 7 can be formed by other isolation techniques, including but not limited to, mesa isolation, local oxidation of silicon (LOCOS) isolation, etc.

FIG. 2 further illustrates one embodiment of forming a first gate structure 6 directly on a first surface of the second semiconductor layer 30. The first gate structure 6 can be formed using deposition, photolithography and a selective etching process. In one example, material layers for the gate dielectric and gate conductor layers of the first gate structure 6 are first blanket deposited on the second semiconductor layer 30. Following deposition, the material layers are patterned and etched to provide the first gate structure 6. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap) may be used to form the first gate structure 6. The dielectric cap may be formed by first depositing a dielectric hard mask material, like SiN or $SiO_2$, atop a layer of the uppermost gate electrode material and then applying a photoresist pattern to the hard mask material using a lithography process steps. The photoresist pattern is transferred into the hard mask material using a dry etch process forming the dielectric cap. Next the photoresist pattern is removed and the dielectric cap pattern is transferred into the gate electrode material during a selective etching process. The dielectric cap may be removed by a wet or dry etch prior to the silicidation process. Alternatively, the first gate structure 6 can be formed by other patterning techniques, such as spacer image transfer. A replacement gate process may also be used in providing the first gate structure 6.

The first gate structure 6 may include at least a gate conductor layer atop a first gate dielectric layer 9. Gate conductor layer may be a first metal gate conductor layer 3. The first metal gate conductor layer 3 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The gate structure may further include a first semiconductor gate conductor layer 8 atop the first metal gate conductor layer 3. In one example, the first semiconductor gate conductor layer 8 may be a doped semiconductor material, such as a doped silicon containing material, e.g., doped polysilicon. When a combination of conductive elements is employed, an optional diffusion barrier material such as TaN or WN may be formed between the conductive materials. The gate conductors of the gate structure are typically present on a first gate dielectric layer 9. The first gate dielectric layer 9 may be a dielectric material, such as $SiO_2$, or alternatively high-k dielectrics, such as oxides of Ta, Zr, Al or combinations thereof. In another embodiment, the first gate dielectric layer 9 is comprised of an oxide, such as $SiO_2$, $ZrO_2$, $Ta_2O_5$ or $Al_2O_3$. In one embodiment, the first gate dielectric layer 9 has a thickness ranging from 1 nm to 20 nm. In another embodiment, the first gate dielectric layer 9 has a thickness ranging from 0.5 nm to 2.5 nm.

In some embodiments, following the formation of the first gate structure 6, source and drain regions may be formed in the second semiconductor layer 30 and the first semiconductor layer 25. In one example, the source and drain regions include source and drain extension regions 45, deep source and drain regions 46, and halo regions (not shown). In some embodiments, ion implantation of different doses and implant energies in combination with spacers adjacent to the first gate structure 6 dictate the location and abruptness of the source and drain regions.

Source and drain extension regions 45 may be formed using an ion implantation process or other doping techniques including but not limited to, gas phase doping, solid phase doping, plasma doping, cluster implantation, etc. More specifically, in one example of a p-type field effect transistor, when forming source and drain extension regions 45, the dopant species may be boron or $BF_2$. Boron may be implanted utilizing implant energies ranging 0.2 keV to 3.0 keV with an implant dose ranging from $1\times10^{14}$ atoms/cm$^2$ to $5\times10^{15}$ atoms/cm$^2$. $BF_2$ may be implanted utilizing implant energies ranging from 1.0 keV to 15.0 keV and having an implant dose ranging from $1\times10^{14}$ atoms/cm$^2$ to $5\times10^{15}$ atoms/cm$^2$. In another example, in which the field effect transistor is an n-type device, the source and drain extension regions 45 may be implanted with at least one of antimony, arsenic and phosphorous using similar implant doses and implant energies as described above for forming the source and drain extension regions 45 of a p-type field effect transistor. Although not depicted in FIG. 2, halo regions may be implanted into the second semiconductor layer 30 using an angled implant and a dopant of opposite conductivity than the source and drain extension regions 45.

Still referring to FIG. 2, at least one spacer 11 may be formed in direct physical contact with the sidewalls of the first gate structure 6. The at least one spacer 11 may be composed of oxide, i.e., $SiO_2$, but may also comprise nitride or oxynitride materials. Each spacer 11 may have a width ranging from 3.0 nm to 100.0 nm. The at least one spacer 11 can be formed by deposition and etch processes. For example, a dielectric layer may be deposited using deposition processes, including, but not limited to, chemical vapor deposition (CVD), plasma-assisted CVD, and low-pressure chemical vapor deposition (LPCVD). Following deposition, the dielectric layer is then etched to define the geometry of the spacer 11 using an anisotropic plasma etch procedure such as, reactive ion etch.

Deep source and drain regions 46 are formed in the second semiconductor layer 30 and the first semiconductor layer 25 by ion implantation or any other doping technique described above for forming the extension regions 45. The deep source and drain regions 46 typically have the same conductivity as the corresponding source and drain extension regions 45. Typical implant species for deep source and drain regions 46 having a p-type conductivity may include boron or $BF_2$. The deep source and drain regions 46 can be implanted with boron utilizing an energy ranging from 1.0 keV to 8.0 keV with a dose ranging from $1\times10^{15}$ atoms/cm$^2$ to $7\times10^{15}$ atoms/cm$^2$. The deep source and drain regions 46 may also be implanted with $BF_2$ with an implant energy ranging from 5.0 keV to 40.0 keV and a dose ranging from $1\times10^{15}$ atoms/cm$^2$ to $7\times10^{15}$ atoms/cm$^2$. Deep source and drain regions 46 having an n-type conductivity may be implanted with phosphorus using an energy of about 3 keV to 15 keV with a dose of about $1\times10^{15}$ atoms/cm$^2$ to about $7\times10^{15}$ atoms/cm$^2$.

FIG. 2 further depicts one embodiment of forming raised source and drain (RSD) regions 21 atop the exposed surfaces of the second semiconductor layer 30 on opposing sides of the first gate structure 6. The thickness of the spacer 11 determines the proximity of the subsequently formed raised source and drain (RSD) regions 21 to the channel of the device. In one embodiment, the raised source and drain (RSD) regions 21 are formed using an epitaxial growth process. A number of different sources may be used for the deposition of epitaxial silicon. Silicon sources for epitaxial growth include silicon tetrachloride ($SiCl_4$), dichlorosilane ($SiH_2Cl_2$), and silane ($SiH_4$), etc. Germanium sources for epitaxial growth include $GeH_4$, $Ge_eH_6$, $Ge_3H_3$, $GeH_3 Br$, $GeH_3 Cl$, $GeF_3Cl$, $GeH_2 Br_2$, $GeH_2 Cl_2$, $GeCl_2 F_2$ $GeHCl_3$, $GeCl_3 F$, $GeCl_4$, $GeBr_4$, and $GeHBr_3$. In one embodiment, the temperature for epitaxial silicon deposition typically ranges from 400° C. to 900° C. The raised source and drain regions 21 are typically doped to have the same conductivity as the source and drain extension regions 45 and the deep source and drain regions 46. The raised source and drain (RSD) regions 21 can be in-situ doped (doped during the epitaxial growth of RSD) or ex-situ doped, i.e., doped after the epitaxial growth of the raised source and drain (RSD) regions 21, by any suitable doping technique such as implantation.

In one embodiment, in which the source and drain extension regions 45 have not been introduced by ion implantation, dopant diffused from the raised source and drain (RSD) regions 21 into the second semiconductor layer 30 provides the source and drain extension regions 45. In one embodiment, the dopant from the raised source and drain (RSD) regions 21 is diffused into the second semiconductor layer 30 by an annealing processes including, but not limited to rapid thermal annealing, furnace annealing, flash lamp annealing, laser annealing, or any suitable combination of thereof In one embodiment, thermal annealing to diffuse the dopant from the raised source and drain (RSD) regions 21 into the second semiconductor layer 30 is conducted at a temperature ranging from 850° C. to 1350° C.

When present, the dielectric cap from the first gate structure 6 may be removed using a selective etch process. Silicides 22 may then be formed on the first gate structure 6 and the raised source and drain (RSD) regions 21 of the device. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining unreacted metal is removed by an etch process selective to silicides 22.

Following silicide 22 formation, a dielectric material can be blanket deposited atop the entire substrate and planarized to provide an interlevel dielectric layer 23. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 23 include: any of the aforementioned materials in porous form, or in a form that changes during processing to or from being porous and/or permeable to being non-porous and/or non-permeable. The interlevel dielectric layer 23 is patterned and etched to form via holes to the various source/drain and gate conductor regions of the device. Following via formation, studs 24 are formed by depositing a conductive metal into the via holes using deposition methods, such as CVD or plating. The conductive metal may include, but is not limited to tungsten, copper, aluminum, silver, gold and alloys thereof. Thereafter, an interconnect line 26 is formed atop the studs 24 and the interlevel dielectric layer 23 to provide the structure depicted in FIG. 2. The interconnect line 26 may be composed of a conductive metal selected from the group consisting of tungsten, copper, aluminum, silver, titanium, tantalum, gold and alloys thereof. The interconnect line 26 may be deposited using CVD or plating.

Figure 3:
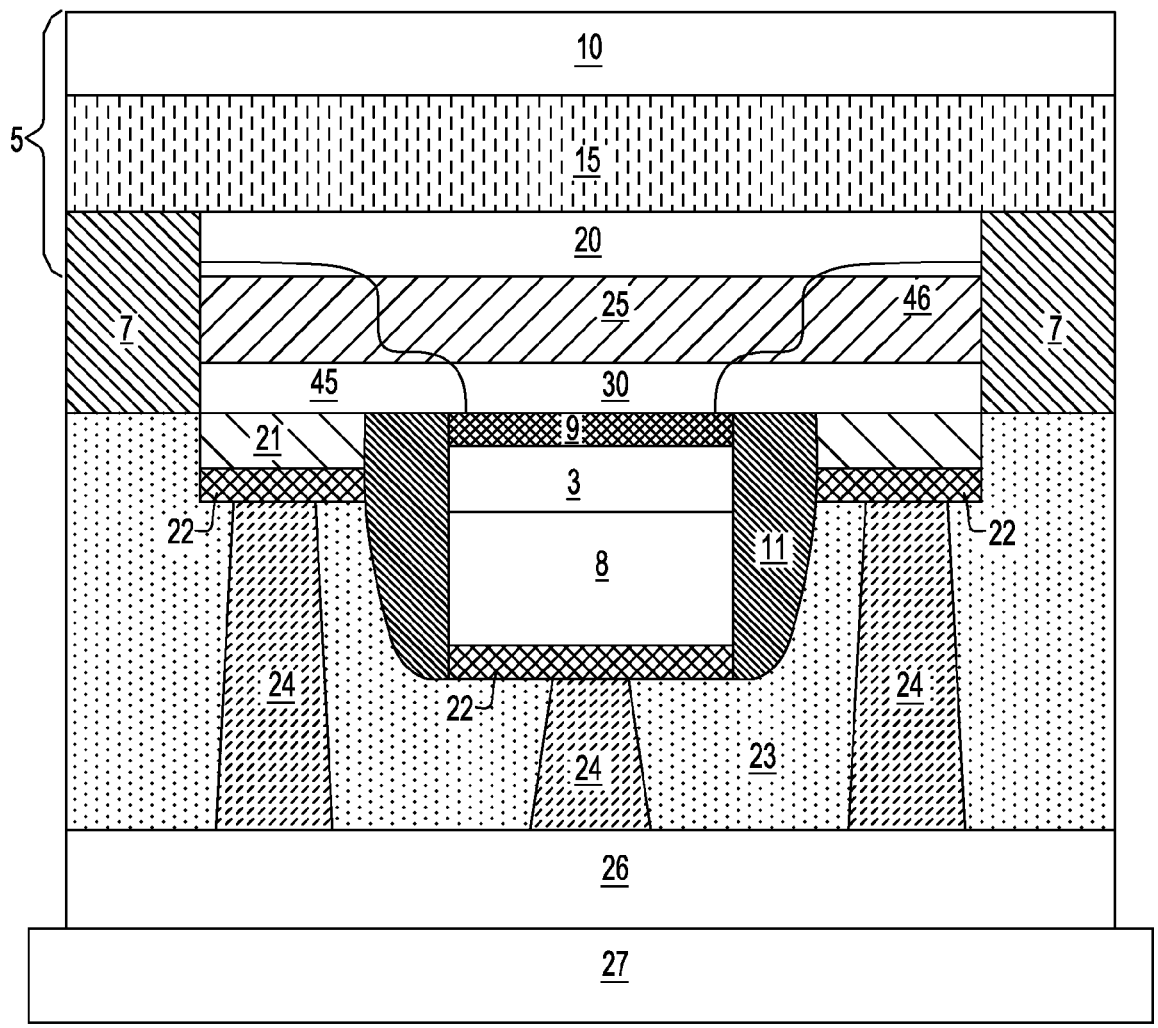
FIG. 3 is a side cross-sectional view depicting bonding the interconnect line of the structure depicted in FIG. 2 to a carrier substrate, in accordance with one embodiment of the present invention.

In a following process sequence the structure depicted in FIG. 2 is inverted, i.e., flipped, and bonded to a carrier, such as a carrier substrate 27. FIG. 3 depicts bonding the structure depicted in FIG. 2 to a carrier substrate 27. In one embodiment, the carrier substrate 27 is composed of a semiconductor material. Examples of semiconductor materials that are suitable for the carrier substrate 27 include, but are not limited to Si, strained Si, SiC, SiGe, SiGeC, Si alloys, Ge, Ge alloys, GaAs, InAs, InP as well as other III/V and II/VI compound semiconductors. In another example, the carrier substrate 27 may be composed of a dielectric, such as an oxide, nitride or oxynitride material. In yet another example, the carrier substrate 27 includes a combination of the aforementioned semiconductor and dielectric materials.

The carrier substrate 27 may be bonded to the structure depicted in FIG. 2 using adhesive bonding or thermal bonding. Examples of adhesives suitable for bonding the carrier substrate 27 to the interconnect line 26 include solder, wax and polymer. In the embodiments utilizing thermal bonding methods, the carrier substrate 27 is thermally bonded to the interconnect line 26 through intermediate dielectric layers (not shown) positioned between the carrier substrate 27 and the interconnect line 26. More specifically, in one example, a planar surface of the carrier substrate 27 is contacted to a planar surface of the interconnect line 26 through an intermediate dielectric layer under pressure and increased temperature that is sufficient to provide a bond. The temperature of the thermal bonding method may range from 100° C. to 400° C. In another embodiment, thermal bonding between the interconnect line 26 and the carrier substrate 27 may be achieved without the intermediate dielectric layer.

Figure 4:
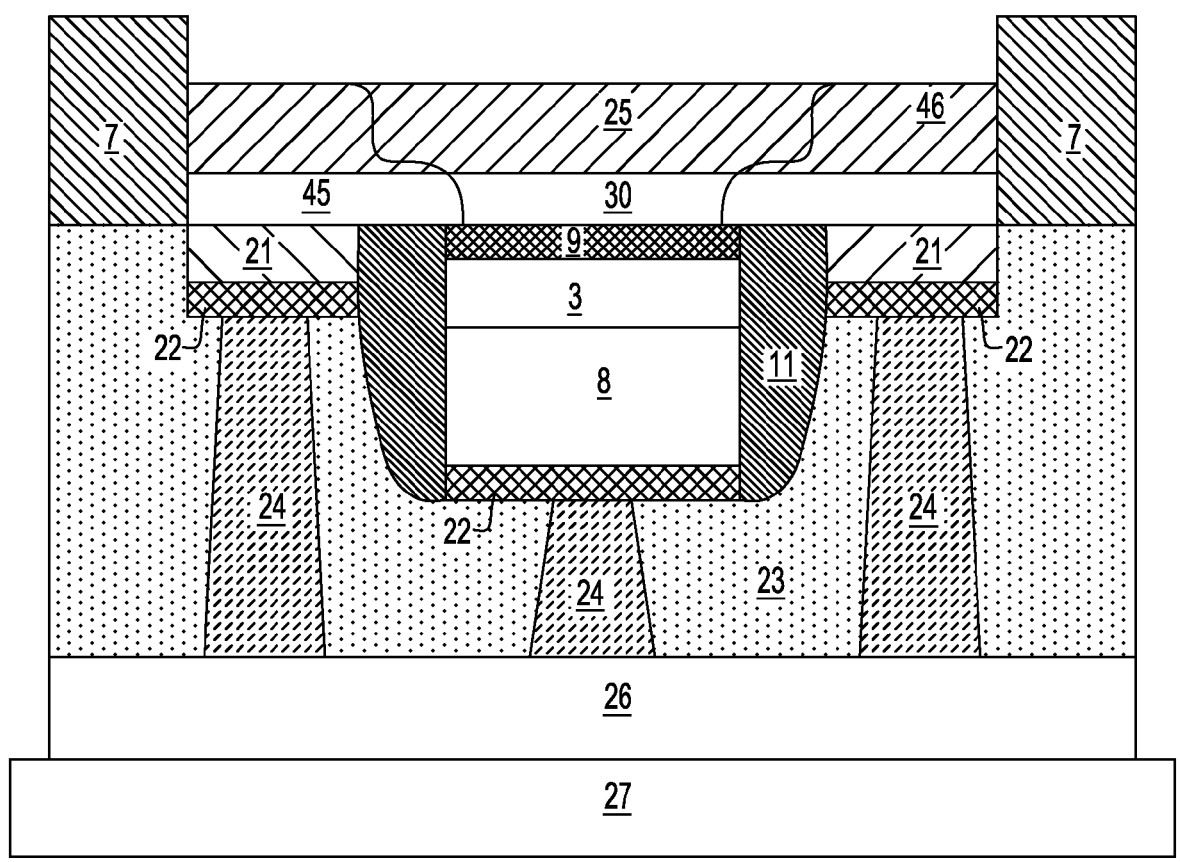
FIG. 4 is a side cross-sectional view depicting removing the handling substrate selective to the first semiconductor layer, in accordance with one embodiment of the present invention.

FIG. 4 depicts removing the handling substrate 5. In one embodiment, the handling substrate 5 is removed by grinding, polishing, selective etch, or a combination hereof. As used herein, the term "selective" in reference to a material removal process denotes that the rate of material removal for a first material is greater than the rate of removal for at least another material of the structure to which the material removal process is being applied. The selective etch process may be an anisotropic etch, such as reactive ion etching, or the selective etch process may be an isotropic etch, such as a wet chemical etch.

In one example, the handling substrate 5 is first grinded, polished, and then etched by a selective etch process that removes the handling substrate 5 includes etching the lower semiconductor layer 10 of the handling substrate 5 selective to the dielectric layer 15 of the handling substrate 5. In one embodiment, in which the lower semiconductor layer 10 is composed of silicon and the dielectric layer 15 is composed of silicon oxide, the etch chemistry for removing the lower semiconductor layer 10 selective to the dielectric layer 15 comprises potassium hydroxide aqueous solutions (KOH), ammonium hydroxide ($NH_4OH$), ethylene diamine pyrocatechol aqueous solution (EDP), tetramethylammonium hydroxide aqueous (TMAH), or hydrazine ($N_2H_2$). In a subsequent process step, the dielectric layer 15 may be etched selective to the upper semiconductor layer 20 and the isolation regions 7. In one embodiment, when the dielectric layer 15 and the isolation regions 7 are composed of silicon oxide, and the upper semiconductor layer is composed of silicon, the etch chemistry for removing the dielectric layer 15 selective to the isolation regions 7 and the upper semiconductor layer 20 comprises hydrofluoric acid. In another embodiment, the lower semiconductor layer 10 and the dielectric layer 15 may be removed by a planarization process, such as chemical mechanical planarization, stopping on the upper semiconductor layer 20. As used herein, "planarization" is a material removal process that employs at least mechanical forces, such as frictional media, to produce a planar surface. "Chemical Mechanical Planarization" is a material removal process using both chemical reactions and mechanical forces to remove material and planarize a surface.

Still referring to FIG. 4, the upper semiconductor layer 20 of the handling substrate 5 may then be removed selective to the first semiconductor layer 25 using a selective etch process. In one embodiment, the upper semiconductor layer 20 is etched selective to the first semiconductor layer 25 and the isolation regions 7. The selective etch process may include anisotropic etching, such as reactive ion etch, or isotropic etching, such as wet chemical etching. In one embodiment, in which the upper semiconductor layer 20 of the handling substrate 5 is composed of silicon, the isolation regions 7 is composed of silicon oxide, and the first semiconductor layer 25 is composed of silicon germanium, the etch chemistry for removing the upper semiconductor layer 20 is composed of a solution of $HF:H_2O_2:CH_3COOH$.

Figure 5:
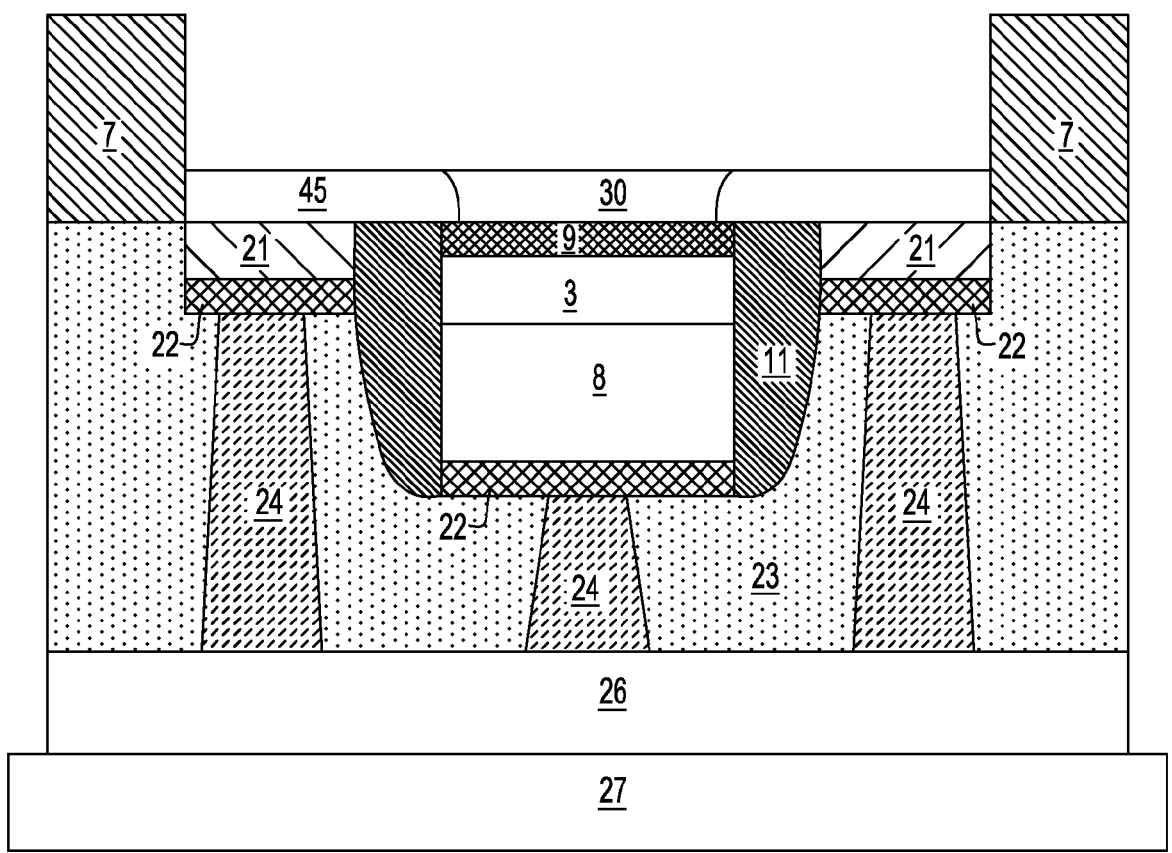
FIG. 5 is a side cross-sectional view depicting removing the first semiconductor layer selective to the second semiconductor layer, in accordance with one embodiment of the present invention.

FIG. 5 depicts removing the first semiconductor layer 25 selective to the second semiconductor layer 30. In one embodiment, removing the first semiconductor layer 25 and the upper semiconductor layer 20 of the handling substrate 5 removes the segregated dopants that are present at the interface of the semiconductor layers, i.e., first semiconductor layer 25 and the upper semiconductor layer 20, that are present over the dielectric layer 15, i.e., buried dielectric layer, of the handling substrate 5. Dopant segregation at the interface of the buried dielectric layer and the upper semiconductor layer of prior devices that employ semiconductor-on-insulator (SOI) substrates typically results in increased resistance (extension resistance) at the source and drain extension regions. In one embodiment, the present method reduces source and drain resistance by reducing dopant segregation. Dopant segregation is reduced by removing the first semiconductor layer 25, as well as the upper semiconductor layer 20 of the handling substrate 5, selective to the second semiconductor layer 30.

In one embodiment, the first semiconductor layer 25 may be etched selective to the second semiconductor layer 30 using an anisotropic or isotropic etching process. In one embodiment, in which the first semiconductor layer 25 is composed of silicon germanium, and the second semiconductor layer 30 is composed of silicon, the etch chemistry for removing the first semiconductor layer 25 selective to the second semiconductor layer 30 is composed of tetramethylammonium hydroxide aqueous (TMAH). Removing the first semiconductor layer 25 exposes a surface of the second semiconductor layer 30 that is opposite the surface of the second semiconductor layer 30 on which the first gate structure 6 is present.

Figure 6A:
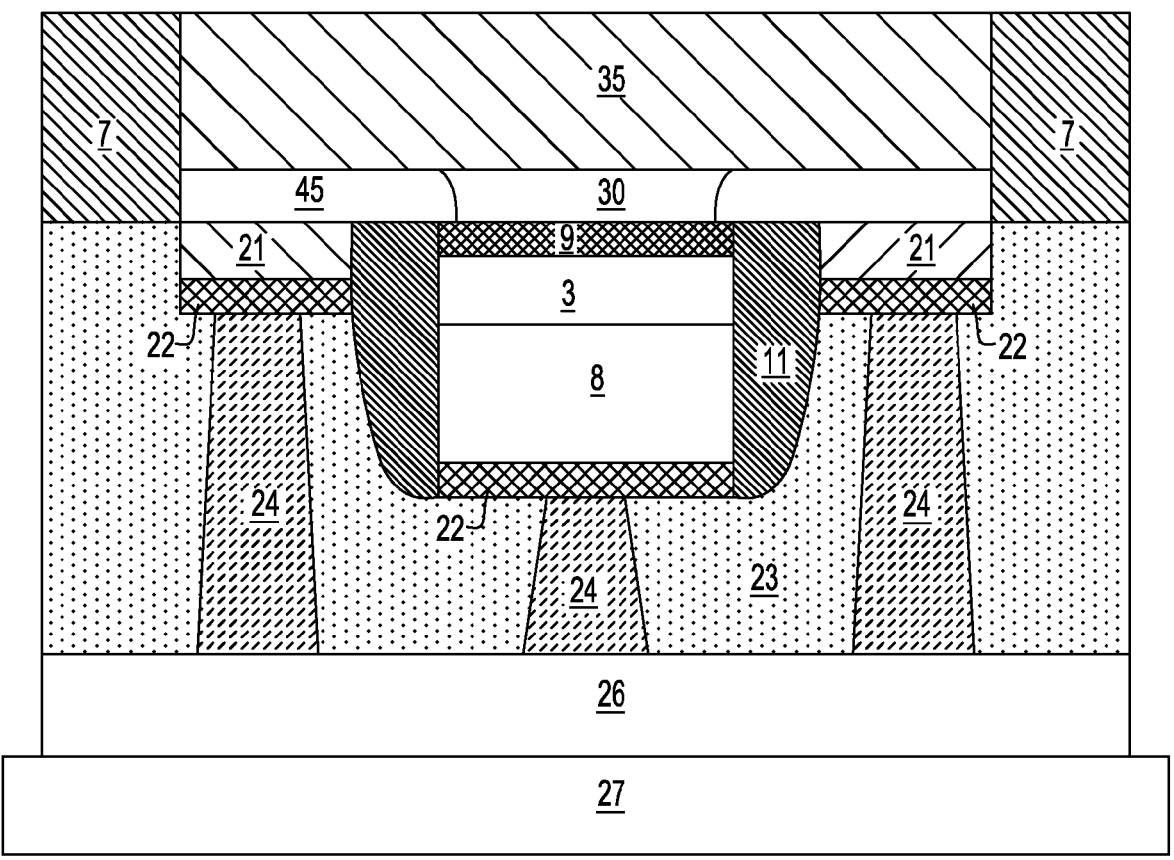
FIG. 6A is a side cross sectional view depicting forming a dielectric region in contact with the second surface of the second semiconductor layer, in accordance with one embodiment of the present invention.

FIG. 6A depicts one embodiment of a semiconductor device formed using the method sequence depicted in FIGS. 1-5. It is noted that the semiconductor device depicted in FIG. 6A is inverted. In the embodiment depicted in FIG. 6A, a dielectric region 35 is formed on the exposed surface, i.e., second surface, of the second semiconductor layer 30 that is opposite the surface, i.e., first surface, of the second semiconductor layer 30 that the first gate structure 6 is present on. The dielectric region 35 may be composed of any solid dielectric material. The dielectric region 35 may be composed of an oxide, nitride, or oxynitride. In one embodiment, the dielectric region 35 is composed of silicon oxide. In another example, the dielectric region 35 is composed of silicon nitride. The thickness of the dielectric region 35 may range from 5 nm to 100 nm. In another embodiment, the thickness of the dielectric region 35 may range from 15 nm to 50 nm. In one embodiment, the surface of the dielectric region 35 that is opposite the surface that is in direct contact with the second semiconductor layer 30 may be planarized to be coplanar with a surface of the isolation regions 7.

The embodiment depicted in FIG. 6A is a semiconductor device, i.e., field effect transistor, having a single gate structure and having a semiconductor-on-insulator (SOI) substrate configuration. The semiconductor device depicted in FIG. 6A includes a channel region formed from an extremely thin semiconductor-on-insulator (ETSOI) layer that is provided by the second semiconductor layer 30. The second semiconductor layer 30 has a thickness that is less than 20 nm. In one embodiment, the second semiconductor layer 30 has a thickness ranging from 1.0 nm to 20 nm. In another embodiment, the second semiconductor layer 30 has a thickness ranging from 1.0 nm to 5.0 nm. In a further embodiment, the second semiconductor layer 30 has a thickness ranging from 3.0 nm to 8.0 nm.

In one embodiment, the semiconductor device that is depicted in FIG. 6A includes an interface between the second semiconductor layer 30 and the dielectric region 35 having a low concentration of segregated dopants. In one embodiment, the segregated dopant concentration in the dielectric region 35 proximate to the interface of the second semiconductor layer 30 and the dielectric region 35 ranges from $1\times10^{15}$ dopants/cm$^3$ to $1\times10^{19}$ dopants/cm$^3$. In another embodiment, the segregated dopant concentration in the dielectric region 35 proximate to the interface of the second semiconductor layer 30 and the dielectric region 35 ranges from $1\times10^{15}$ dopants/cm$^3$ to $1\times10^{18}$ dopants/cm$^3$. The low segregated dopant concentration in the dielectric region 35 provides a semiconductor device having a source and drain extension region resistivity that ranges from $1\times10^{-4}$ ohm cm to $2\times10^{-3}$ ohm cm. In another embodiment, the semiconductor device has a source and drain extension region resistance that ranges from $1\times10^{-4}$ ohm cm to $5\times10^{-4}$ ohm cm.

Figure 6B:
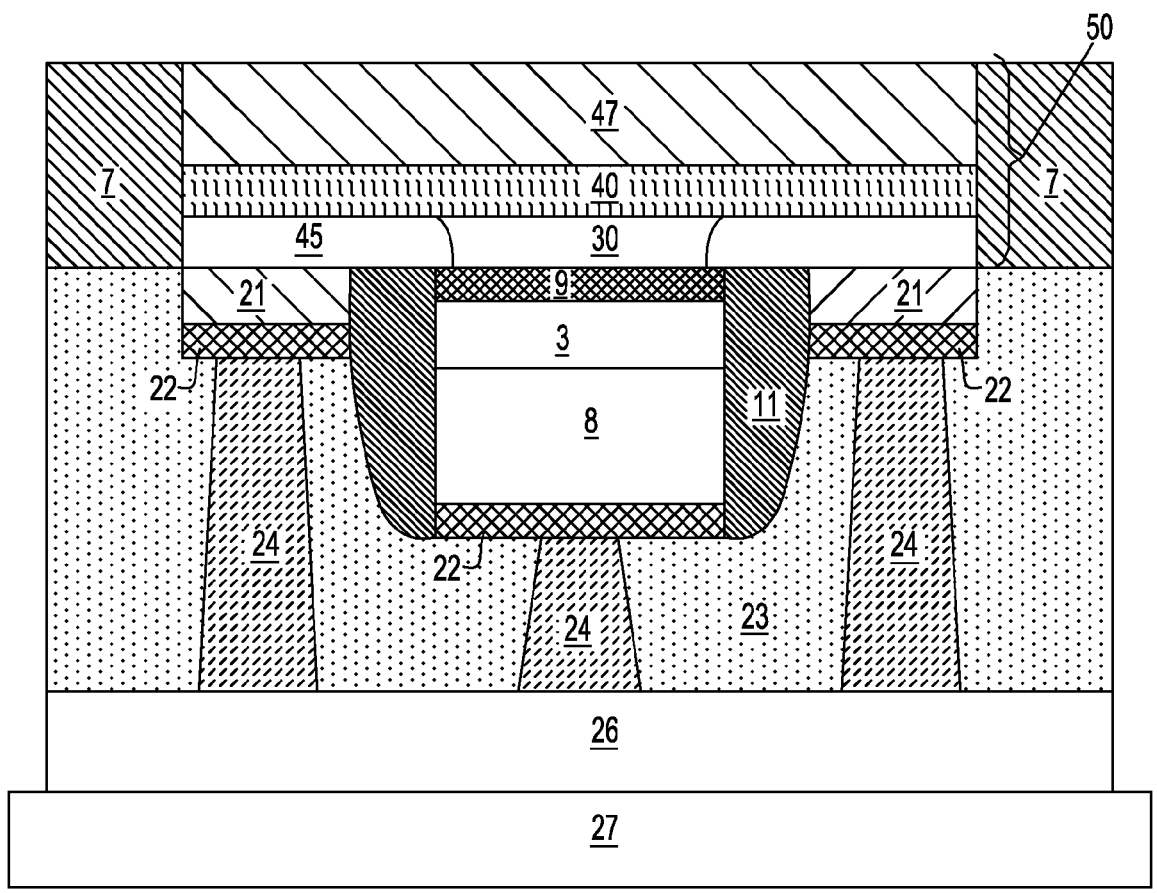
FIG. 6B is a side cross sectional view depicting forming a second gate structure in contact with the second surface of the second semiconductor layer, in accordance with the present invention.

FIG. 6B depicts another embodiment of a semiconductor device formed using the method sequence depicted in FIGS. 1-5. It is noted that the semiconductor device depicted in FIG. 6B is inverted. In the embodiment depicted in FIG. 6B, a second gate structure 50, i.e., back gate structure, is formed in contact with the exposed surface of the second semiconductor layer 30 that is opposite the surface of the second semiconductor layer 30 that is in contact with the first gate structure 6. In one embodiment, the second gate structure 50 includes a second gate dielectric layer 40 and a second gate conductor layer 47. The second gate dielectric layer 40 is formed on the exposed surface of the second semiconductor layer 30 using a deposition or growth process. One example of a deposition method that is suitable for depositing the second gate dielectric layer 40 is atomic layer deposition (ALD), molecular layer deposition (MLD), or chemical vapor deposition (CVD). Variations of processes suitable for depositing the second gate dielectric layer 40 include, but are not limited to: atomic layer deposition (ALD), molecular layer deposition (MLD), Atmospheric Pressure CVD (APCVD), Low Pressure CVD (LPCVD), Plasma Enhanced CVD (EPCVD), Metal-Organic CVD (MOCVD), and combinations thereof. Examples of growth processes that may form the second gate dielectric layer 40 include thermal growth processes, such as thermal oxidation. Suitable examples of dielectric materials that can be employed as the second gate dielectric layer 40 include, but are not limited to: silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The second gate conductor layer 47 is typically composed of a conductive semiconductor or metal material. In one embodiment, the second gate conductor layer 47 is polysilicon. In other embodiments, the second gate conductor layer is comprised of Ge, SiGe, SiGeC, metal silicides, metallic nitrides, or metals. Metals suitable for the second gate conductor layer 47 include W, Ir, Re, Ru, Ti, Ta, Hf, Mo, Nb, Ni, Al or combinations thereof.

The embodiment depicted in FIG. 6B is a semiconductor device, i.e., field effect transistor, having a first gate structure 6, i.e., front gate, and a second gate structure 50, i.e., back gate. Each of the gate structures depicted in FIG. 6B are in contact with a channel region that is provided by the second semiconductor layer 30, wherein the second semiconductor layer 30 has a thickness of less than 20 nm. Similar to the semiconductor device depicted in FIG. 6A, the semiconductor device depicted in FIG. 6B has a low concentration dopants segregated in the second gate dielectric layer 40 and has a low source and drain extension region resistance.

Figure 6C:
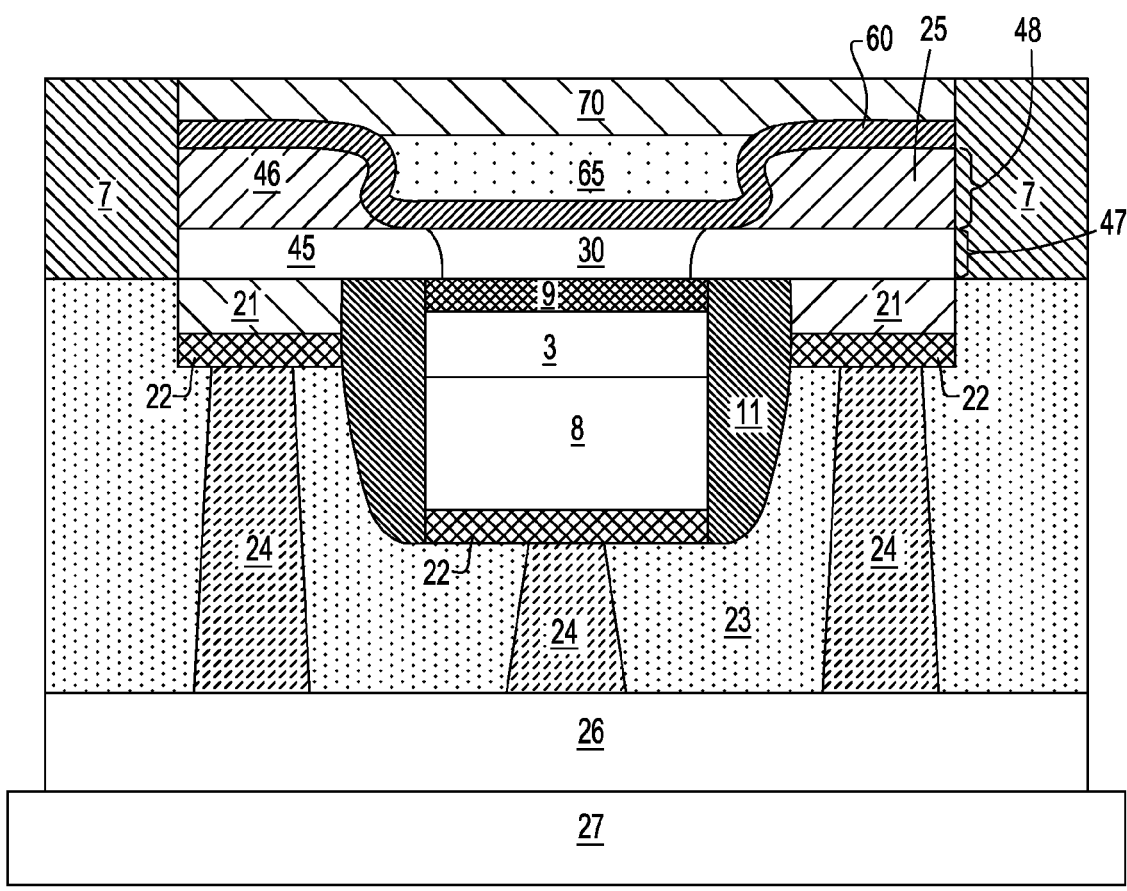
FIG. 6C is a side cross sectional view depicting another embodiment of forming a second gate structure in contact with the second semiconductor layer, in which following removing the handling substrate, the first semiconductor layer is etched using a selective etch that removes the portions of the first semiconductor layer that are not doped selective to the doped portions, and a conformal gate dielectric is deposited on the remaining portion of the first semiconductor layer and the second semiconductor layer.

FIG. 6C depicts another embodiment of a semiconductor device formed using the method sequence depicted in FIGS. 1-5. It is noted that FIG. 6C depicts an inverted device. FIG. 6C depicts one embodiment of a semiconductor device that includes a channel region, i.e., second semiconductor layer 30, comprised of a semiconductor material having a thickness of less than 20 nm, and source and drain regions present on opposing sides of the channel region. The source and drain regions have an upper layer 47 composed of a first semiconductor material and a lower layer 48 composed of a second semiconductor material. In one embodiment, the upper layer 47 is composed of silicon and the lower layer 48 is composed of SiGe. The lower layer 48 provides the deep source and drain regions 46 of the device. A first gate structure 6 is formed including a first gate dielectric 9 in contact with a first surface of the channel region and at least one first gate conductor 3, 8 in contact with the first gate dielectric 9. A second gate structure is in contact with a second surface of the channel region, wherein the second gate structure is composed of a conformal gate dielectric 60 present in direct contact with the lower layer 48 of the source and drain region and the channel region, and a second gate conductor 65 in contact with the conformal gate dielectric layer 60.

The source and drain regions that are depicted in FIG. 6B may be provided by a selective etch process that is employed following removal of the upper semiconductor layer 20 of the handling substrate 5. The selective etch process that provides the source and drain regions depicted in FIG. 6B may be an etch process that is applied to the first semiconductor layer 25, which removes the un-doped portions of first semiconductor layer 25 selective to the doped portions of the first semiconductor layer 25. In one embodiment, in which the first semiconductor layer 25 is composed of silicon germanium, the undoped portions of the first semiconductor layer are etched selective to p-type doped regions of the first semiconductor layer 25 that provide the deep source and drain regions 46 by an etch chemistry composed of ammonia. In one embodiment, the etch chemistry that removes the undoped portion of the first semiconductor layer 25 is selective to the second semiconductor layer 30.

The conformal gate dielectric layer 60 that is formed atop the remaining portion of the first semiconductor layer, i.e., lower layer 48 of the source and drain regions, and the exposed surface of the second semiconductor layer 30 may be an oxide material that has a thickness ranging from 2.5 nm to 5.0 nm. The term "conformal" denotes a layer having a thickness that does not deviate from greater than or less than 20% of an average value for the thickness of the layer.

In one embodiment, the conformal gate dielectric layer 60 may be formed using deposition techniques, such as chemical vapor deposition (CVD), atomic layer CVD (ALCVD), pulsed CVD, plasma of photo assisted CVD, sputtering, and chemical solution deposition. In another embodiment, the conformal gate dielectric layer 60 is formed by thermal growing process, which may include oxidation, oxynitridation, nitridation, and/or plasma or radical treatment. Suitable examples of oxides that can be employed for the conformal gate dielectric layer 60 include, but are not limited to: silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and combinations and multi-layers thereof. It is noted that the conformal gate dielectric layer 60 may also be composed of a high-k dielectric material, wherein high-k dielectric materials have a dielectric constant of 3.9 or greater, typically on the order of 4.0, and in some instances greater than 7.0.

The second gate conductor layer 65 is typically composed of a conductive semiconductor or metal material. In one embodiment, the second gate conductor layer 65 is polysilicon. In other embodiments, the second gate conductor is comprised of germanium, silicon germanium, silicon germanium carbon, metal silicides, metallic nitrides, or metals. Exemplary materials suitable for the second gate conductor 65 include, but are not limited to, tungsten, titanium, tantalum, ruthenium, zirconium, cobalt, copper, aluminum, lead, platinum, tin, silver, gold, tantalum nitride, titanium nitride, tungsten silicide, tungsten nitride, ruthenium oxide, cobalt silicide, nickel silicide, carbon nanotube, conductive carbon, or any suitable combination of these materials. The conductive material may further comprise dopants that are incorporated during or after deposition.

In one embodiment, the second gate conductor 65 may be recessed until the exposed surface of the second gate conductor 65 is substantially coplanar with lower surface of the remaining portion of the first semiconductor layer 25, i.e., the lower layer 48 of the source and drain regions. The second gate conductor 65 may be recessed using an anisotropic etch process, such as reactive ion etch, that is selective to the conformal gate dielectric layer 60. As illustrated in FIG. 6C, the second gate conductor 65 is surrounded by the deep source and drain regions 46. Therefore, the second gate conductor 65 is advantageously self-aligned to the channel 30 and the first metal gate conductor layer 3 of the first gate structure 6.

An encapsulating dielectric layer 70 may be formed overlying the exposed surfaces of the conformal gate dielectric layer 60 and the second gate conductor 65. The encapsulating dielectric layer 70 may be composed of solid dielectric material. The encapsulating dielectric layer 70 may be composed of an oxide, nitride, and oxynitride. In one embodiment, the encapsulating dielectric layer 70 is composed of silicon oxide. In another embodiment, the encapsulating dielectric layer 70 is composed of silicon nitride. The thickness of the encapsulating dielectric layer 70 may range from 5 nm to 100 nm. In another embodiment, the thickness of the dielectric region 35 may range from 15 nm to 50 nm. The surface of the encapsulating dielectric layer 70 that is opposite the surface that is in direct contact with the second semiconductor layer 30 may be planarized to be coplanar with a surface of the isolation regions 7.

The embodiment depicted in FIG. 6C is a semiconductor device, i.e., field effect transistor, having a first gate structure 6, i.e., front gate, and a second gate structure 60, 65, i.e., back gate. Each of the gate structures depicted in FIG. 6C are in contact with a channel region that is provided by the second semiconductor layer 30, wherein the second semiconductor layer 30 has a thickness of less than 20 nm. Similar to the semiconductor device depicted in FIGS. 6A and 6B, the semiconductor device depicted in FIG. 6C has a low concentration of segregated dopants, and has a low source and drain extension region resistance. Further, the first gate structure 6 may be aligned to the second gate conductor 65. In one embodiment, the first gate structure 6 is self-aligned to the second gate conductor 65.

In each of the embodiments depicted in FIGS. 6A, 6B and 6C, the carrier substrate 27 may be removed using planarization or etching.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor device comprising:
    providing a handling substrate;
    forming a first semiconductor layer on the handling substrate;
    epitaxially growing a second semiconductor layer on the first semiconductor layer, wherein the composition of the second semiconductor layer is different than the first semiconductor layer and the second semiconductor layer has a thickness of less than 20 nm;
    forming a first gate structure on a first surface of the second semiconductor layer;
    forming a source region and a drain region adjacent to the first gate structure, wherein at least a portion of dopant of the source and drain regions is present in at least the second semiconductor layer;
    removing the handling substrate and the first semiconductor layer to expose a second surface of the second semiconductor layer that is opposite the first surface of the second semiconductor layer; and
    forming one of a second gate structure or a dielectric region in contact with the second surface of the second semiconductor layer.

2. The method of claim 1, wherein the handling wafer comprises a layered substrate comprised of an upper semiconductor layer and a lower semiconductor layer that are separated by a dielectric layer disposed therebetween.

3. The method of claim 1, wherein the first semiconductor layer is comprised of silicon germanium.

4. The method of claim 3, wherein the silicon germanium is formed using deposition or an epitaxial growth process.

5. The method of claim 1, wherein the second semiconductor layer is comprised of silicon.

6. The method of claim 1, wherein the forming of the first gate structure on the first surface of the second semiconductor layer comprises:
    forming a first gate dielectric layer on the first surface of the second semiconductor layer;
    forming a first metal gate conductor layer on the first gate dielectric layer;
    forming a first semiconductor gate conductor layer on the first metal gate conductor layer; and
    patterning the first gate dielectric layer, the first metal gate conductor layer and the first semiconductor gate conductor layer to provide the first gate structure.

7. The method of claim 1, wherein the forming of the source region and the drain region comprises epitaxial growth of a raised source region and a raised drain region, wherein during an annealing step dopant from the raised source region and the raised drain region diffuses to the second semiconductor layer.

8. The method of claim 7, wherein the raised source region and the raised drain region comprise in-situ doped semiconductor material of p-type or n-type conductivity.

9. The method of claim 1, wherein the forming of the source region and the drain region comprises ion implantation of a p-type or n-type dopant in portions of the second semiconductor layer adjacent to a portion of the second semiconductor layer on which the first gate structure is present.

10. The method of claim 2, further comprising forming isolation regions extending from the second semiconductor layer to the dielectric layer of the handling substrate.

11. The method of claim 10, further comprising forming an interlevel dielectric layer overlying the first gate structure and the source region and drain region; forming contacts to the source regions and the drain regions through the interlevel dielectric layer; and forming an interconnect line to the contacts.

12. The method of claim 11, further comprising bonding the interconnect line to a carrier substrate.

13. The method of claim 11, wherein the removing of the handling substrate and the first semiconductor layer to expose the second surface of the second semiconductor layer that is opposite the first surface of the semiconductor layer comprises:
    etching the lower semiconductor layer selected to the dielectric layer;
    etching the dielectric layer selective to the upper semiconductor layer; and
    etching the first semiconductor layer selective to the second semiconductor layer.

14. The method of claim 1, wherein the forming of the second gate structure comprises depositing a second gate dielectric on the second surface of the second semiconductor layer and depositing a second gate conductor on the second gate dielectric.

15. The method of claim 1, wherein the forming of the dielectric region comprises depositing a dielectric material into contact with the second surface of the second semiconductor layer.

16. The method of claim 1, wherein the dopant of the source region and the drain region is present in the second semiconductor layer and the first semiconductor layer, in which removing the handling substrate and the first semiconductor layer comprises
- etching the lower semiconductor layer selected to the dielectric layer;
- etching the dielectric layer selective to the upper semiconductor layer; and
- etching non-doped portions of the first semiconductor layer selective to doped portions of the second semiconductor layer.

17. The method of claim 16, wherein forming the second gate comprises forming a conformal gate dielectric layer on a remaining portion of the first semiconductor layer and a second semiconductor layer, forming a second gate conductor on the conformal gate dielectric layer, and forming a dielectric material on the second gate conductor.

* * * * *